United States Patent [19]
Niyogi et al.

[11] Patent Number: 5,504,784
[45] Date of Patent: Apr. 2, 1996

[54] VITERBI ALGORITHM DECODING METHOD AND APPARATUS

[76] Inventors: Sourabh Niyogi, P.O. Box 397322, Cambridge, Mass. 02139; Alan L. Wilson, 3720 Alder Dr., Hoffman Estates, Ill. 60195

[21] Appl. No.: 132,732

[22] Filed: Oct. 6, 1993

[51] Int. Cl.$^6$ .................................................. H04L 27/06
[52] U.S. Cl. ................................................ 375/341; 375/323
[58] Field of Search ................................. 375/262, 269, 375/279–281, 283, 323, 324, 329–332, 340–341; 371/43; 329/300, 304, 315, 321, 345, 347, 361

[56] References Cited

U.S. PATENT DOCUMENTS

| | | | |
|---|---|---|---|
| 4,477,916 | 10/1984 | Chung | 375/296 |
| 5,134,635 | 7/1992 | Hong et al. | 375/341 |
| 5,289,504 | 2/1994 | Wilson et al. | 375/316 |
| 5,315,620 | 5/1994 | Halawani et al. | 329/304 |

*Primary Examiner*—Young T. Tse
*Attorney, Agent, or Firm*—Susan L. Lukasik

[57] ABSTRACT

A method of decoding (311 and 417) by Viterbi algorithm is applied with a metric that limits effects on the metric's value. A received signal (109) comprised of symbols is filtered, thereby providing (303 and 403) a phase angle of the received signal (109) and providing (305 and 409) a magnitude of the received signal (109). The phase angle of the received signal (109) and the magnitude of the received signal (109) are sampled (309 and 413) once per symbol and then decoded according to the Viterbi algorithm with a metric that limits effects on the metric's value as the difference between the sampled phase angle and the decoded symbol increases.

21 Claims, 3 Drawing Sheets

FIG. 5-1
303/403
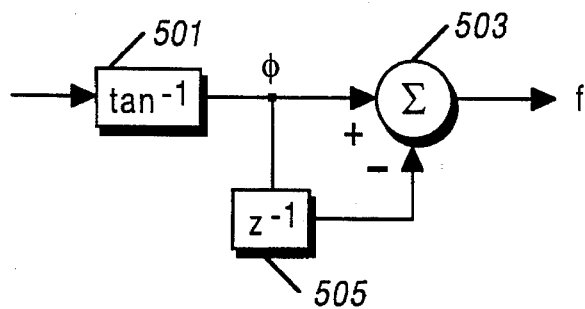
FIG. 5-2
305/409
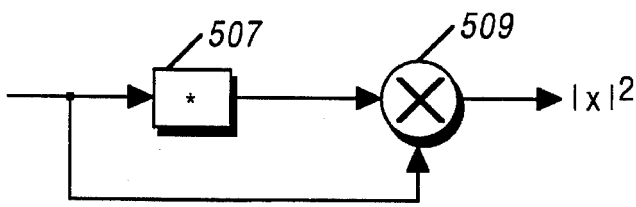
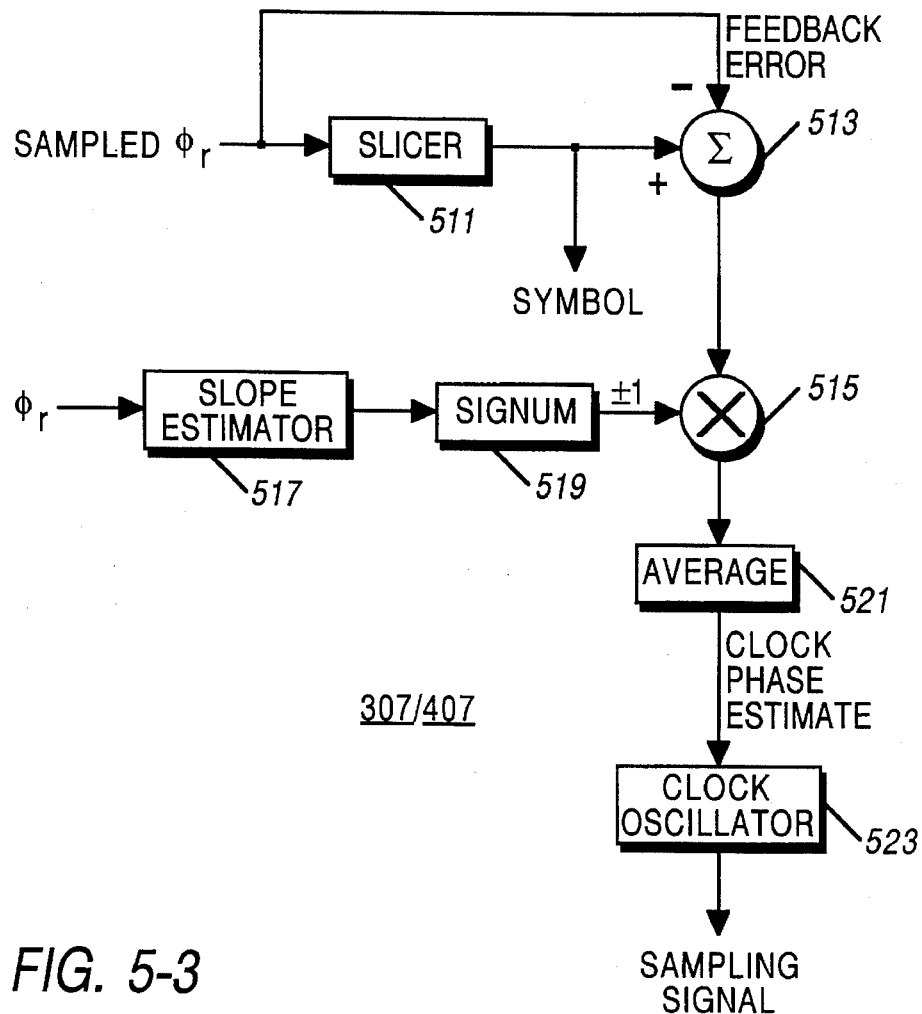
307/407
FIG. 5-3

VITERBI ALGORITHM DECODING METHOD AND APPARATUS

FIELD OF THE INVENTION

This invention relates to radio frequency signals, including but not limited to decoding of radio frequency signals by Viterbi algorithm.

BACKGROUND OF THE INVENTION

Spectrally efficient digital modulation over radio channels requires the use of multilevel/multiphase signals. This type of signal is very sensitive to time-varying amplitude and phase distortion associated with land mobile communications, such as Rayleigh fading.

To improve the sensitivity of the transmission system without increasing its bandwidth, trellis coded modulation techniques are used. Historically, such a technique has been used to improve the transmission performance over channels where the main source of errors is additive noise. At the receiver, a decoder that uses the Viterbi algorithm with a Euclidean metric, such as $\phi^2$, is used to recover the transmitted information from the trellis coded sequence. This type of decoder is optimum if the noise associated with the samples at the channel output is Gaussian and its samples taken at the symbol rate are uncorrelated. Neither of these conditions, however, applies to land mobile radio receivers. As a result, decoding by use of Viterbi algorithm with a Euclidean metric in a Rayleigh fading environment makes performance of the trellis coding scheme worse than its uncoded counterpart, due to rapid phase variation when the signal undergoes a deep fade.

Accordingly, there is a need for a method of decoding that limits the effects of rapid phase variation in deep fades.

BRIEF DESCRIPTION OF THE DRAWINGS

FIG. 5-1 is a block diagram of a discriminator in accordance with the invention.

FIG. 5-2 is a block diagram of a magnitude-squared function block in accordance with the invention.

FIG. 5-3 is a block diagram of a stochastic gradient bit recovery function in accordance with the invention.

DESCRIPTION OF THE PREFERRED EMBODIMENT

The following describes an apparatus for and method of decoding by Viterbi algorithm that applies a metric that limits effects on the metric's value as the difference between the sampled phase angle and the decoded symbol increases.

A received signal comprised of symbols is filtered, thereby providing a phase angle, $\phi$, of the received signal and a magnitude, $r^2$, of the received signal. The phase angle of the received signal and the magnitude of the received signal are sampled once per symbol, thereby producing a sampled phase angle and a sampled magnitude. The sampled phase angle and the sampled magnitude are decoded into a decoded symbol according to the Viterbi algorithm, using a metric that limits effects on the metric's value as the difference between the sampled phase angle and the decoded symbol increases. In the preferred embodiment, such a metric is $2r^2(1-\cos \Delta\phi)$ or $2r^2(1-\{\sin \Delta\phi\}/\Delta\phi)$, where $\Delta\phi$ is the difference between the phase angle of the received signal and the phase of the decoded symbol. In the preferred embodiment, a gaussian low pass filter further filters the magnitude, an integrate-and-dump filter further filters the phase angle, and stochastic gradient bit recovery provides a sampling signal for the sampling step. The present invention is further incorporated in a radio receiver.

In an FM (Frequency Modulation) receiver, the phase angle of the received signal is the integrated frequency deviation of the signal, hence when applying the present invention to an FM receiver, the following results. A received signal comprised of symbols is filtered, providing a frequency deviation of the received signal. A magnitude of the received signal is computed. The magnitude is filtered such that the filtered magnitude and the frequency deviation of the received signal are synchronous to each other. The frequency deviation of the received signal is filtered, providing a phase angle of the received signal. A clock phase of the signal is recovered. The frequency deviation of the received signal and the filtered magnitude of the received signal are sampled once per symbol using the clock phase, thereby producing a sampled frequency deviation and a sampled magnitude. The sampled frequency deviation and the sampled magnitude are decoded into a decoded symbol according to the Viterbi algorithm, using a metric that limits effects on the metric's value as the difference between the sampled frequency deviation and the decoded symbol increases.

Figure 1:
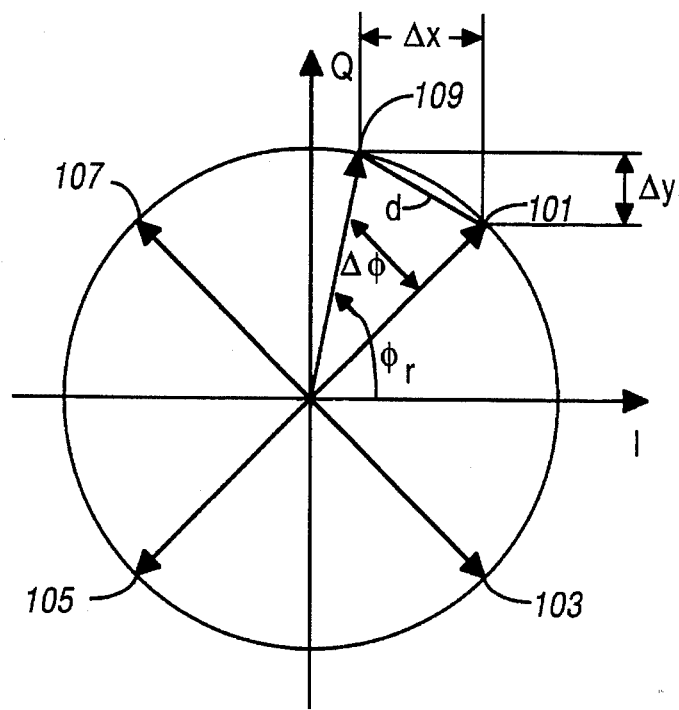
FIG. 1 is a constellation showing a received symbol among the expected symbols in accordance with the invention.

A constellation in the form of a graph of I versus Q is shown in FIG. 1, where the expected, i.e., decoded, symbols 101, 103, 105, and 107 appear at the midpoint of the arc in each of the four quadrants of the graph. A received symbol 109 has a phase angle, $\phi r$. The received symbol 109 is a distance $\Delta\phi$ from the decoded symbol 101. The distance between the received symbol 109 and the decoded symbol 101 is d. In the present invention, the demodulation technique used is QPSK-c modulation, but other types of modulation may also be used, such as QPSK (Quaternary Phase Shift Keying), DQPSK (Differential QPSK), CORPSK (Correlated PSK) and FSK (Frequency Shift Keying). QPSK-c, where the c stands for compatible, is a linear differential form of QPSK that is AM and FM compatible. In each of these modulations, the constellation points fall on a circle.

Figure 2:
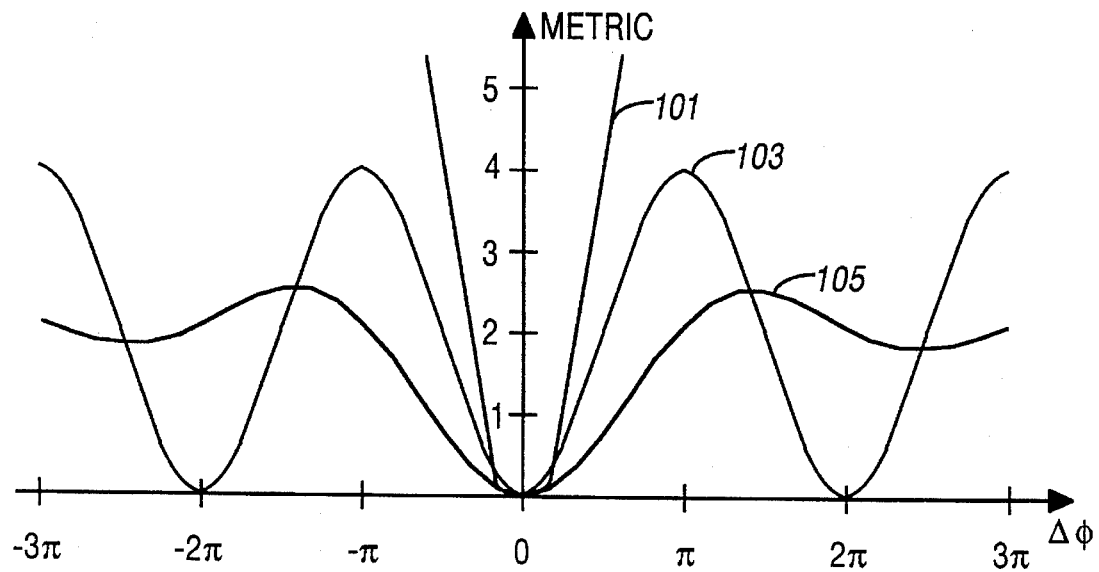
FIG. 2 is a graph comparing different decoding metrics.

A graph comparing three decoding metrics versus phase angle error, $\Delta\phi$, is shown in FIG. 2. In each of the metrics shown 101, 103, and 105, $r^2$ is assumed to be unity for ease of comparison. As previously noted, $\Delta\phi$ is the difference between the phase angle of the received signal and the phase of the decoded symbol. If a typical Euclidean metric, such as $r^2(\Delta\phi)^2$ which is consistent with prior art teachings, is used to decode by Viterbi algorithm, the resultant graph of the metric appears similar to the first curve 101 of FIG. 2, where the metric value is unlimited as $\Delta\phi$ increases, thus the metric increases without bound as $\Delta\phi$ increases. The second curve 103 shows a graph of a metric, $2r^2(1-\cos \Delta\phi)$, in accordance with the present invention. As can be seen from the second curve 103, the metric in the present invention limits effects on the metric's value as the difference between the sampled phase angle and the decoded symbol increases.

The third curve 105 shows a graph of a metric, $2r^2(1-\{\sin \Delta\phi\}/\Delta\phi)$, also in accordance with the present invention. As can be seen from the third curve 105, the third metric also limits effects on the metric's value as the difference between the sampled phase angle and the decoded symbol increases. Hence, the effect on the metric in the present invention is limited as $\Delta\phi$ increases, and thus does not increase without bound, as does the typical metric as would be found in the prior art. As a result, the value of the metric is limited as $\Delta\phi$ increases, and hence a metric in accord with the present invention limits the negative effects of rapid phase variation in deep fades.

Figure 3:
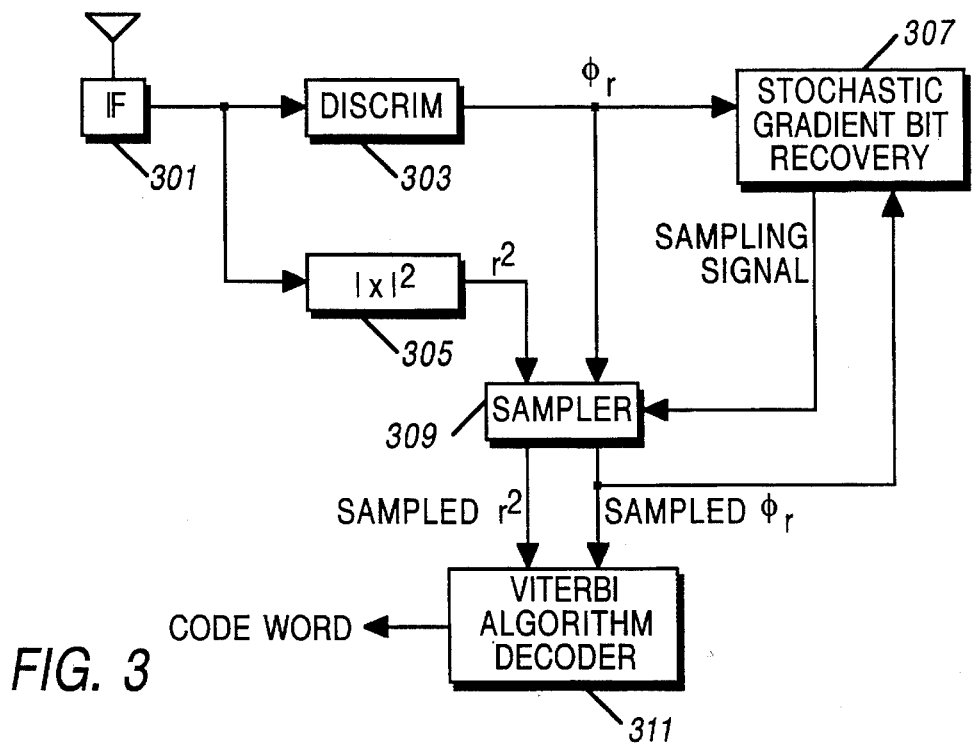
FIG. 3 is a block diagram of a radio receiver that provides a phase angle and a magnitude of a received signal in accordance with the invention.

A block diagram of a radio receiver that provides a phase angle and a magnitude of a received signal is shown in FIG. 3. A received signal enters the receiver through an antenna and enters an IF (Intermediate Frequency) filter 301. The IF filter 301 processes the received signal to baseband data and outputs data, as I (in-phase) and Q (quadrature) data, to a conventional discriminator 303 and a magnitude-squared function block 305. Details of the discriminator 303 appear in FIG. 5-1, where the delay block 505 is a unit symbol time delay. Details of the magnitude-squared function block 305 appear in FIG. 5-2.

The output of the discriminator 303, the phase angle $\phi r$, is input to a stochastic gradient bit recovery block 307 and a sampler 309. The magnitude-squared block 305 outputs the magnitude of the received signal, which is input to the sampler 309. The sampler 309 samples the phase angle, $\phi r$, and the magnitude, $r^2$, using the sampling signal provided by the stochastic gradient bit recovery block 307, as shown in and described for FIG. 5-3. The output of the sampler 309, sampled $\phi r$ and sampled $r^2$, is input to a Viterbi algorithm decoder 311. The sampler 309 outputs sampled $\phi r$ to the stochastic gradient bit recovery block 307 as well.

The stochastic gradient bit recovery block 307, as is known in the art, recovers a sampling signal, also known as a clock signal, and sends it to the sampler 309 for use in sampling the phase angle, $\phi r$, and the filtered magnitude, $r^2$, of the received signal once per symbol.

The Viterbi algorithm decoder 311, by applying the Viterbi algorithm using one of the metrics as previously described, decodes the data from the sampler 309 into a code word that is used in conventional ways that are known in the art. In the present invention, the metric used in the Viterbi algorithm is a metric that limits effects on the metric's value as $\Delta\phi$ increases. In particular, the preferred embodiment uses one of two metrics: $2r^2(1-\cos\Delta\phi)$ and $2r^2(1-\{\sin\Delta\phi\}/\Delta\phi)$. In the preferred embodiment, a rate ¾ Viterbi algorithm is used. As applied, three input bits (or one tri-bit) are coded into four output bits, in the form of two di-bits, to effectuate a rate ¾ code.

Figure 4:
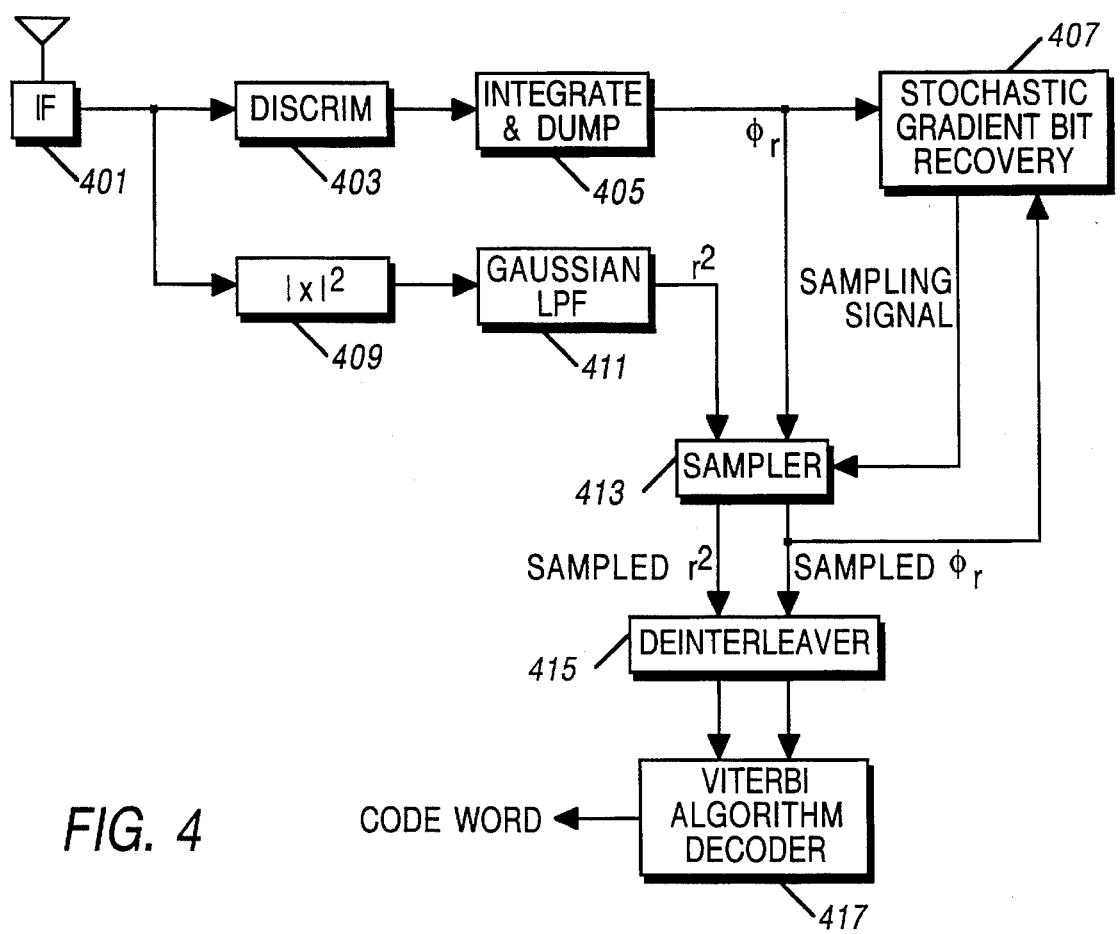
FIG. 4 is a block diagram of a radio receiver that provides filtering by an integrate-and-dump filter and a gaussian lowpass filter in accordance with the invention.

A block diagram of a radio receiver that provides filtering by an integrate-and-dump filter and a gaussian lowpass filter is shown in FIG. 4. A signal enters the receiver through an antenna and enters an IF (Intermediate Frequency) filter 401. The IF filter 401 processes the received signal to baseband data and outputs data, as I (in-phase) and Q (quadrature) data, to a conventional discriminator 403 and a magnitude-squared function block 409. Details of the discriminator 403 and the magnitude-squared function block 409 appear in FIG. 5-1 and FIG. 5-2, respectively.

The output of the discriminator 403 is input to an integrate-and-dump filter 405, which provides a phase angle of the received signal in the form of an integrated differential phase angle. The impulse response for the integrate-and-dump filter 405 is derived below, in a closed-form solution that is expressed in terms of the sine integral function $Si(x)$, which is well known in the art. A band-limited integrate-and-dump filter is achieved when a portion of the side lobes are filtered out of the frequency response. The portion of the frequency response that is necessary for good fidelity in the symbol recovery is in the range $-(1+\alpha)/(2T)$ Hz to $(1+\alpha)/(2T)$ Hz, where T is the time duration of a symbol. Because of a spectral null at $1/T$ Hz, the response is restricted to $1/T$ Hz cutoff. Where $H(x)$ is the frequency response of a band-limited integrate-and-dump filter:

$$H(x) = \frac{\sin(\pi x)}{\pi x} \quad \text{for} |x| < 1$$

$$H(x) = 0 \quad \text{for} |x| \geq 1.$$

Where $h(t)$ is the impulse response of the filter $H(x)$, $\omega = 2\pi x$, and $H(\omega)$ is an even function:

$$h(t) =$$

$$\frac{1}{2\pi}\int_{-\infty}^{\infty} H(\omega)e^{j\omega t}d\omega = \frac{1}{2\pi}\int_{-2\pi}^{2\pi}\frac{\sin(\omega/2)}{\omega/2}e^{j\omega t}d\omega =$$

$$\frac{1}{\pi}\int_{0}^{2\pi}\frac{2}{\omega}\sin(\omega/2)\cos(\omega t)d\omega =$$

$$\frac{1}{\pi}\int_{0}^{2\pi}\frac{1}{\omega}(\sin\{(t+1/2)\omega\} - \sin\{(t-1/2)\omega\})d\omega =$$

$$\frac{1}{\pi}\left(\int_{0}^{2\pi(t+1/2)}\sin(y)\frac{dy}{y} - \int_{0}^{2\pi(t-1/2)}\sin(y)\frac{dy}{y}\right) =$$

$$\frac{1}{\pi}(Si\{2\pi(t+1/2)\} - Si\{2\pi(t-1/2)\}) \text{ where}$$

$$Si(x) = \int_{0}^{x}\sin(t)\frac{dt}{t}.$$

Although the above implementation is shown in band-limited form, band-limiting is optional and is not required for the present invention. The output, $\phi r$, of the integrate-and-dump filter 405 is input to a stochastic gradient bit recovery block 407 and a sampler 413. The sampler 413 samples the integrated differential phase angle, $\phi r$, and the filtered magnitude, $r^2$, using the sampling signal provided by the stochastic gradient bit recovery block 407, as shown in and described for FIG. 5-3. The output of the sampler 413, sampled $\phi r$ and sampled $r^2$, is input to a deinterleaver 415 that deinterleaves this input data by placing the data in the order it was in before the data entered an interleaver where the data was transmitted. Interleaving and deinterleaving are well known in the art and are not necessary for successful application of the present invention. The sampler 413 outputs sampled $\phi r$ to the stochastic gradient bit recovery block 407 as well.

The stochastic gradient bit recovery block 407, as is known in the art, recovers a sampling signal, also known as a clock signal, and sends it to the sampler 413 for use in sampling the integrated differential phase angle, $\phi r$, and the filtered magnitude, $r^2$, of the received signal once per symbol.

The magnitude-squared block 409 outputs the magnitude of the received signal, which is input to a Gaussian low pass filter (LPF) 411. The Gaussian LPF integrates or averages the amplitude of its input over one or more symbol periods. The Gaussian LPF 411 filters the magnitude thereby outputting a filtered magnitude, such that the filtered magnitude, $r^2$, and the integrated differential phase angle, φr, are synchronous to each other, i.e., the filtered magnitude and integrated differential phase angle reach the Viterbi algorithm decoder 417 at substantially the same time for processing.

The output, $r^2$, of the Gaussian low pass filter 411 is input to the sampler 413, which samples the signal thereby providing a sampled $r^2$ to the deinterleaver 415, which deinterleaves the sampled $r^2$ values and passes them to the Viterbi algorithm decoder 417. The Viterbi algorithm decoder 417, by applying the Viterbi algorithm using one of the metrics as previously described, decodes the data from the deinterleaver 415 into a code word that is used in conventional ways that are known in the art. In the present invention, the metric used in the Viterbi algorithm is a metric that limits effects on the metric's value as Δφ increases. In particular, the preferred embodiment uses one of two metrics: $2r^2(1-\cos \Delta\phi)$ and $2r^2(1-\{\sin \Delta\phi\}/\Delta\phi)$. In the preferred embodiment, a rate ¾ Viterbi algorithm is used. As applied, three input bits (or one tri-bit) are coded into four output bits, in the form of two di-bits, to effectuate a rate ¾ code.

A block diagram of a discriminator 303/403 is shown in FIG. 5-1. The input of the discriminator, I and Q samples from the received signal, enters an inverse tangent function block 501, which outputs the inverse tangent of its input as a phase angle, φ, to a positive input of a summer 503 and a delay block 505, which is a unit sample for the discriminator 403 of FIG. 4 in the preferred embodiment. In the preferred embodiment, the received signal is sampled at a rate that is at least twice the symbol rate. The output of the delay block 505 is input to a negative input of the summer 503, which provides the discriminator output. The output, f, of the summer 503 is the filtered phase angle, which is also the frequency deviation of the signal for an FM receiver. The discriminator shown in FIG. 5-1 is used in a typical frequency demodulator for FSK or QPSK-c modulations. A discriminator 303 for a typical DQPSK receiver, such as is shown in FIG. 3, is structurally the same as the discriminator shown in FIG. 5-1, except that the delay block 505 is a unit symbol time delay. A discriminator (not shown) for a typical QPSK receiver uses only the inverse tangent function block 501, which outputs a phase angle, and hence does not have the summer 503 or the delay block 505.

A block diagram of a magnitude-squared function block 305/409 is shown in FIG. 5-2. The magnitude-squared is taken for the I and Q samples from the IF filter 301/401 output by taking the complex conjugate of the I and Q samples in a complex conjugate block 507 and multiplying the complex conjugate by the IF filter 301/401 output, I and Q, in a multiplier 509, which outputs the magnitude squared of the input I and Q samples, which is taken to be the magnitude of the received signal.

A block diagram of a stochastic gradient bit recovery block 307/407 is shown in FIG. 5-3. The stochastic gradient bit recovery function is known in the art. The signal, sample φr, is input to a slicer 511 and a negative input to a summer 513 in the form of a feedback error signal. The output of the slicer 511 is a symbol, which is input to the positive input of the summer 513. The output of the summer is input to a multiplier 515.

The signal, φr, is input to a slope estimator 517, which provides a slope of φr for a signum function block 519. The signum function block 519 provides an output of +1 to the multiplier 515. The output of the multiplier 515 is input to an averaging block 521, which outputs a clock phase estimate to a clock oscillator 523. The clock oscillator outputs the sampling signal, as previously described.

In the preferred embodiment, a DSP (Digital Signal Processor), such as a DSP 56001 available from Motorola, Inc., is used to implement all of the functions except for the IF filter 301 and 401, including the Viterbi algorithm. The Viterbi algorithm and methods for applying it are well known in the art, including DSP implementations. In general, the Viterbi algorithm efficiently searches all the paths that a received signal can follow through a trellis to find the coded signal that is closest to the received signal using a metric. The metric measures the distance between the received signal and any possible coded signal. In the present invention, the metric limits effects on the metric's value as the difference between the sampled phase angle and the decoded symbol increases, i.e., as Δφ increases. In the preferred embodiment, such a metric is $2r^2(1-\cos \Delta\phi)$ or $2r^2(1-\{\sin \Delta\phi\}/\Delta\phi)$. Further benefit is derived from these metrics by skillful selection of the metric in the present invention. For example, in the preferred embodiment, the metric $2r^2(1-\cos \Delta\phi)$ is applied to received signals that are modulated by QPSK, QPSK-c, DQPSK, or CORPSK modulations before transmission. The metric $2r^2(1-\{\sin \Delta\phi\}/\Delta\phi)$ is applied to received signals that are modulated by FSK modulation before transmission.

The preferred embodiment uses one of two metrics: $2r^2(1-\cos \Delta\phi)$ and $2r^2(1-\{\sin \Delta\phi\}/\Delta\phi)$. Although only two metrics are given by way of example, other metrics that limit effects on the metric's value as Δφ increases exist that are within the spirit and scope of the invention. Such other metrics include Bessel functions, Gaussian pulses, and other forms of sine and cosine functions.

Thus, the present invention provides a metric for the Viterbi algorithm, where the metric limits effects on the metric's value as Δφ increases. Because the value of the metric is limited as Δφ increases, the application of this metric in a decoder, as taught by the present invention, limits the negative effects of rapid phase variation in deep fades. A frequency demodulator does not have any bound on the instantaneous frequency deviation that it can detect. When the received signal becomes small, as it would in a fade, the frequency deviation can become infinite. When the receiver integrates the instantaneous frequency deviation to determine a phase angle, the phase can likewise increase without bound. Consequently, this invention, by utilizing a metric that is designed to be insensitive to this effect, provides a receiver that achieves an improvement in sensitivity by resisting fades.

What is claimed is:

1. A method comprising the steps of:

filtering a received signal comprised of symbols, thereby providing a phase angle of the received angle and a magnitude of the received signal;

sampling, using a sampling signal, the phase angle of the received signal and the magnitude of the received signal once per symbol, thereby producing a sampled phase angle and a sampled magnitude; and decoding, according to Viterbi algorithm, the sampled phase angle and the sampled magnitude into a decoded symbol using a metric that limits effects on the metric's value as the difference between the sampled phase angle and the decoded symbol increases.

2. The method of claim 1, wherein the magnitude of the received signal is further filtered by a gaussian low pass filter.

3. The method of claim 1, wherein the phase angle of the received signal is further filtered by an integrate-and-dump filter, which thereby provides an integrated differential phase angle.

4. The method of claim 1, wherein the sampling signal for the sampling step is provided by performing stochastic gradient bit recovery.

5. The method of claim 1, wherein the metric is $2r^2(1-\cos \Delta\phi)$, where $r^2$ is the magnitude of the received signal and $\Delta\phi$ is the difference between the phase angle of the received signal and the decoded symbol by the Viterbi algorithm.

6. The method of claim 1, wherein the metric is $2r^2(1-\{\sin \Delta\phi\}/\Delta\phi)$, where $r^2$ is the magnitude of the received signal and $\Delta\phi$ is the difference between the phase angle of the received signal and the decoded symbol by the Viterbi algorithm.

7. An apparatus comprising:
   filters for filtering a received signal comprised of symbols, thereby providing a phase angle of the received signal and a magnitude of the received signal;
   a sampler, operatively coupled to the filters, for sampling the phase angle of the received signal and the magnitude of the received signal once per symbol, thereby producing a sampled phase angle and a sampled magnitude; and
   Viterbi algorithm decoder, operatively coupled to the sampler, for decoding, according to Viterbi algorithm, the sampled phase angle and the sampled magnitude into a decoded symbol using a metric that limits effects on the metric's value as the difference between the sampled phase angle and the decoded symbol increases.

8. The apparatus of claim 7, further comprising a gaussian low pass filter for filtering the magnitude of the received signal.

9. The apparatus of claim 7, further comprising an integrate-and-dump filter for filtering the phase angle of the received signal into an integrated differential phase angle.

10. The apparatus of claim 7, further comprising a stochastic gradient bit recovery circuit, operatively coupled to the sampler, for providing a sampling signal for the sampler.

11. The apparatus of claim 7, wherein the metric is $2r^2(1-\cos \Delta\phi)$, where $r^2$ is the magnitude of the received signal and $\Delta\phi$ is the difference between the phase angle of the received signal and the decoded symbol by the Viterbi algorithm.

12. The apparatus of claim 7, wherein the metric is $2r^2(1-\{\sin \Delta\phi\}/\Delta\phi)$, where $r^2$ is the magnitude of the received signal and $\Delta\phi$ is the difference between the phase angle of the received signal and the decoded symbol by the Viterbi algorithm.

13. The apparatus of claim 7, wherein the filters sampler, and Viterbi algorithm decoder are incorporated in a radio receiver.

14. A method comprising the steps of:
    filtering a received signal comprised of symbols, providing a frequency deviation of the received signal;
    computing a magnitude of the received signal;
    filtering the magnitude such that the filtered magnitude and the frequency deviation of the received signal are synchronous to each other;
    filtering the frequency deviation of the received signal, providing a phase angle of the received signal;
    recovering a clock phase of the received signal;
    sampling the phase angle of the received signal and the filtered magnitude once per symbol using the clock phase, thereby producing a sampled phase angle and a sampled magnitude; and
    decoding, according to Viterbi algorithm, the sampled phase angle and the sampled magnitude into a decoded symbol using a metric that limits effects on the metrics value as the difference between the sampled phase angle and the decoded symbol increases.

15. The method of claim 14, wherein the filtered magnitude is further filtered by a guassian low pass filter.

16. The method of claim 14, wherein the frequency deviation of the received signal is further filtered by an integrate-and-dump filter, which thereby provides an integrated differential phase angle.

17. The method of claim 14, wherein the clock phase of the received signal is provided by performing stochastic gradient bit recovery.

18. The method of claim 14, wherein the metric is $2r^2(1-\cos \Delta\phi)$, where $r^2$ is the filtered magnitude and $\Delta\phi$ is the difference between the phase angle of the received signal and the decoded symbol by the Viterbi algorithm.

19. The method of claim 18, wherein the received signal was modulated by one of QPSK (Quaternary Phase Shift Keying), QPSK-c Quaternary Phase Shift Keying-compatible), DQPSK (Differential QPSK), and CORPSK (Correlated Phase Shift Keying) modulations before transmission.

20. The method of claim 14, wherein the metric is $2r^2(1-\{\sin \Delta\phi\}/\Delta\phi)$, where $r^2$ is the filtered magnitude and $\Delta\phi$ is the difference between the phase angle of the received signal and the decoded symbol by the Viterbi algorithm.

21. The method of claim 20, wherein the received signal was modulated by FSK (Frequency Shift Keying) modulation before transmission.

* * * * *

UNITED STATES PATENT AND TRADEMARK OFFICE
CERTIFICATE OF CORRECTION

PATENT NO. : 5,504,784
DATED : April 2, 1996
INVENTOR(S) : Sourabh Niyogi
Alan L. Wilson It is certified that error appears in the above-indentified patent and that said Letters Patent is hereby corrected as shown below:

Col. 6, line 49, between the words "received" and "and" the word "angle" should be --signal--.

Col. 8, line 20, "metrics" should be --metric's--.

Signed and Sealed this

Sixth Day of August, 1996

*Attest:*

BRUCE LEHMAN

*Attesting Officer*  Commissioner of Patents and Trademarks